(12) United States Patent
Fackelmeier et al.

(10) Patent No.: US 11,300,642 B2
(45) Date of Patent: Apr. 12, 2022

(54) DEVICE, SYSTEM, AND METHOD FOR DATA TRANSMISSION USING WIDEBAND SIGNALS FOR LOCAL COILS

(71) Applicant: Siemens Healthcare GmbH, Erlangen (DE)

(72) Inventors: Andreas Fackelmeier, Thalmässing (DE); Markus Vester, Nuremberg (DE)

(73) Assignee: SIEMENS HEALTHCARE GMBH, Erlangen (DE)

(*) Notice: Subject to any disclaimer, the term of this patent is extended or adjusted under 35 U.S.C. 154(b) by 0 days.

(21) Appl. No.: 16/938,040

(22) Filed: Jul. 24, 2020

(65) Prior Publication Data
US 2021/0025952 A1    Jan. 28, 2021

(30) Foreign Application Priority Data

Jul. 24, 2019  (CN) .......................... 201910669535.0

(51) Int. Cl.
*G01R 33/36* (2006.01)

(52) U.S. Cl.
CPC ..... *G01R 33/3607* (2013.01); *G01R 33/3614* (2013.01); *G01R 33/3621* (2013.01)

(58) Field of Classification Search
CPC ............ G01R 33/3607; G01R 33/3614; G01R 33/3621
See application file for complete search history.

(56) References Cited

U.S. PATENT DOCUMENTS

| 2003/0078004 A1* | 4/2003 | Vester ................ G01R 33/3692 455/42 |
| 2009/0322335 A1 | 12/2009 | Adachi et al. |
| 2011/0109315 A1* | 5/2011 | Biber ................ G01R 33/3621 324/318 |
| 2011/0227574 A1* | 9/2011 | Akita ................ G01R 33/3692 324/322 |
| 2011/0274183 A1 | 11/2011 | Wang |

(Continued)

FOREIGN PATENT DOCUMENTS

DE    102004042118 A1    3/2006

OTHER PUBLICATIONS

German Office Action for German Application No. 10 2020 208 232.4 dated Apr. 12, 2021.
(Continued)

*Primary Examiner* — G. M. A Hyder
(74) *Attorney, Agent, or Firm* — Lempia Summerfield Katz LLC

(57) ABSTRACT

A device for generating wideband signals in a local coil and a magnetic resonance tomography system with the device are provided. The device has a first analog-digital converter for digitizing a magnetic resonance signal, a signal conditioner, a pulse filter, and a transmit antenna. The signal conditioner is configured to increase a harmonic component in an output signal of the first analog-digital converter, and the pulse filter is configured to restrict an output signal of the signal conditioner to a predetermined frequency band before the output signal of the signal conditioner is emitted via the transmit antenna. The receiver is configured to receive and digitize the signal via a receive antenna, and regain a digital representation of the magnetic resonance signal by a signal processor.

13 Claims, 3 Drawing Sheets

(56) References Cited

U.S. PATENT DOCUMENTS

| | | | |
|---|---|---|---|
| 2014/0062480 A1* | 3/2014 | Bollenbeck | G01R 33/3621 324/309 |
| 2014/0097844 A1* | 4/2014 | Tomiha | G01R 33/30 324/321 |
| 2017/0082706 A1* | 3/2017 | Soejima | G01R 33/36 |
| 2018/0081009 A1 | 3/2018 | Duensing et al. | |

OTHER PUBLICATIONS

Wikipedia "Ultra-wideband" https://en.wikipedia.org/wiki/Ultra-wideband Retrieved Jun. 17, 2021. pp. 1-8.

* cited by examiner

DEVICE, SYSTEM, AND METHOD FOR DATA TRANSMISSION USING WIDEBAND SIGNALS FOR LOCAL COILS

This application claims the benefit of Chinese Patent Application CN 201910669535.0, filed on Jul. 24, 2019, which is hereby incorporated by reference in its entirety.

BACKGROUND

The present embodiments relate to a device for generating wideband signals in local coils, and a magnetic resonance tomography system with a local coil and a receiver for receiving the signal of the local coil.

Magnetic resonance tomography systems are imaging devices that, in order to image a subject under examination, align nuclear spins of the subject under examination with a strong external magnetic field, and use an alternating magnetic field to excite the nuclear spins to precess about this alignment. The precession or return of the spins from this excited state into a state with less energy in turn generates, as a response, a magnetic alternating field that is received via antennas.

With the aid of magnetic gradient fields, a spatial encoding is impressed onto the signals, which then permits an assignment of the received signal to a volume element. The received signal is then evaluated, and a three-dimensional imaging representation of the subject under examination is provided.

In order to obtain as good a signal-to-noise ratio as possible, receive antennas, also referred to as local coils, are preferably arranged directly on the body of the patient. In this way, due to the large bandwidth, the received magnetic resonance signals are transmitted after amplification via cable to the magnetic resonance tomography system for evaluation. The cables are however stiff and difficult to handle due to the requisite shields and safety measures.

Approaches already exist in terms of generating the received magnetic resonance signals wirelessly from the local coil to the magnetic resonance tomography system. However, here requisite measures for data compression and transmission security lead to complex modules in the local coil, which, on account of an increased power consumption, restrict the run time during wireless operation due to a limited battery capacity. The additional heating also results in the patient experiencing discomfort.

SUMMARY AND DESCRIPTION

The scope of the present invention is defined solely by the appended claims and is not affected to any degree by the statements within this summary.

The present embodiments may obviate one or more of the drawbacks or limitations in the related art. For example, image acquisition with wireless local coils in magnetic resonance tomography systems is improved.

The device of the present embodiments is provided to generate wideband signals in local coils. Wideband signals may be considered to be signals that are suited to wirelessly transmitting the information content of the magnetic resonance signals from one or more antenna coils in a digitized manner from the local coil to the magnetic resonance tomography system. For example, within the scope of bands with bandwidths of 500 MHZ and multiples between 3 GHz and 11 GHz defined in a regulatory manner under the term "ultra wideband" (UWB) in several countries, signals that have bandwidths between several megahertz up to gigahertz (e.g., up to 500 MHz of one of these UWB) are transmitted.

The device has a first analog-digital converter (ADC). The first analog-digital converter has a signal connection with an antenna coil of the local coil. The magnetic resonance signal may be amplified and filtered before digitalization by a low noise amplifier (LNA) in order to fade out unwanted interference signals. The first analog-digital converter scans the magnetic resonance signal with a sufficiently high scanning frequency according to Nyquist's theorem in order to acquire the required information content with respect to amplitude and phase. In one embodiment, the magnetic resonance signal may be converted into a lower frequency range (e.g., base band) before the scanning; an overscanning with respect to the bandwidth and subsequent digital frequency conversion may also be provided, however.

The signal conditioner obtains the digitized magnetic resonance signal of the first ADC and is configured to increase a harmonic component in the output signal of the first ADC. A frequency component may generally be a harmonic component, the frequency of which lies above the base frequency of the first analog-digital converter that is provided by the scanning rate for a magnetic resonance signal. Conversely, a signal that is produced by mixing or modulating a carrier frequency, such as, for example, amplitude modulation, frequency modulation, phase modulation, QAM, or similar with the ADC output signal is not considered to be a harmonic within the context of the present embodiments.

The pulse filter has a signal connection with the signal conditioner and is configured to restrict the output signal of the signal conditioner to a predetermined frequency band (e.g., to a UWB predetermined in a regulatory manner).

The local coil also has a transmit antenna in signal connection with the chopper. The signal connection may be a passive signal line, but also a radio frequency amplifier, for example. Any antenna suited to emitting a radio frequency signal with the frequencies of the output signal of the chopper is essentially considered here to be a transmit antenna. On account of the required bandwidths, the UWB frequency ranges, which are usually established in the gigahertz range, may be provided. Accordingly, dipole antennas or arrays of such antennas may be suitable, for example. The antennas may also be configured in a planar manner on substrates or as part of the housing of the local coil.

The device of one or more of the present embodiments provides a signal that may be transmitted from the magnetic resonance signals wirelessly with few energy-saving elements in a permitted frequency range with a large bandwidth.

The magnetic resonance tomography system of one or more of the present embodiments has a local coil with a device of one or more of the present embodiments. A transmit antenna for emitting the output signal of the pulse filter is provided in the local coil. The transmit antenna, if supplied with the signal of the pulse filter directly or via an amplifier, produces an electric and/or magnetic radio frequency alternating field in an ultra wideband (UWB), which may be received at least on the magnetic resonance tomography system and/or surrounding the same.

The magnetic resonance tomography system also has a receiver. The receiver has a receive antenna that is configured to convert the electric and/or magnetic alternating field emitted by the inventive device into an electric signal for the receiver and to supply the same hereto. The receiver also has a second analog-digital converter (ADC) that digitizes the received signal. The signal may be amplified beforehand by an input amplifier and be filtered by a bandpass, for example, in order to suppress interference signals in other frequency ranges. A frequency conversion may also be provided. The second ADC may, however, also effect a frequency conversion of the digital signals by overscanning and decimation.

The receiver has a digital signal processing facility, to which the digitized signal is supplied from the second ADC. The signal processing facility is configured to regain the information of the original magnetic resonance signal for the image reconstruction (e.g., digital representation of the magnetic resonance signal) from the signal of the second ADC. For example, the original bit sequence of the digitized magnetic resonance signal may be obtained by corresponding folding back from harmonics of the original signal of the first ADC. When scramblers are used, corresponding complementary algorithms are available to regain the original bit sequence. When redundancy information is used, transmission errors may also be recognized and possibly also corrected.

The receiver that is complementary to the device allows the digitized magnetic resonance signals or information of the digitized magnetic resonance signals is relevant to the image reconstruction to be regained with few discrete components.

In one embodiment, the harmonic component may be increased by the edges of the digital signal being made steeper by the comparator, trigger, or radio frequency amplifier.

In one embodiment, the signal conditioner is a logic circuit that is configured to increase the bit rate. The signal conditioner may be a circuit, for example, that carries out a simple upsampling by bit doubling or multiplication, where each bit is replaced by in each case one bit sequence with two or more bits with a level change. Scramblers or other digital methods, which increase the bit frequency in a deterministic way, are also conceivable, however. Switching circuits that add redundancy information and, in this way, increase the data rate and thus the frequency are also possible. The signal conditioner may essentially also be realized as, for example, part of the first ADC.

By increasing the edge steepness, the frequency component with high frequencies may be increased with minimal energy input and hardware expense. Functions such as scramblers and redundancy also increase the transmission security.

In one embodiment, the pulse filter is provided by active or passive filters (e.g., bandpass filters). Electromechanical filters, such as quartz filters, surface wave filters, or other filter techniques in radio frequency technology are also conceivable, however.

The analog filters cost-effectively allow compliance with the regulatory limit values for ultra wideband.

In one embodiment of the magnetic resonance tomography system, the receiver has a mixer. The mixer is configured to convert the signal of the local coil received by the receive antenna into a lower frequency band.

The conversion of the input signal allows the use of more cost-effective components for the second ADC.

In one embodiment of the magnetic resonance tomography system, the receiver has a plurality of receive antennas. The plurality of receive antennas are arranged at a distance from one another. Distances between the antennas that are greater than a tenth, a fifth, or the half wavelength of the UWB signal produced are considered to be spaced apart, so that the signal with different phase positions arrives at the receive antennas and even with destructive interferences on a receive antenna, an adequately strong signal is received on another receive antenna. The receive antennas may be distributed across the volume or the wall of the patient tunnel.

The receiver has, for example, a selection circuit configured to select one or a combination of the signals of the plurality of receive antennas with an improved signal-to-noise ratio. In one embodiment, for example, the receiver may form a number of different linear combinations of the signals of the receive antennas and may select the linear combination with the largest amplitude. An adaptive selection circuit, which is configured to vary the amplitude ratios and phase shift of the individual receive antenna signals and thus to optimize the receive signal, may also be provided.

Using the selection circuit, the magnetic resonance tomography system is able to suppress signal failures by multipath scattering and interference and to provide a permanent receipt.

In one embodiment of the magnetic resonance tomography system, the receiver has an equalizer. An analog or digital signal processing, which has a non-constant frequency response and/or phase shift, may be an equalizer. A digital equalizer may also enable the characteristics to be adjusted during operation without changing the hardware. During operation, this may also be adaptively provided with a permanent adjustment. The equalizer is configured to compensate for frequency response characteristics of the signal conditioner, pulse filter, transmit antenna, and/or receive antenna. In other words, as a result of a complementary characteristic, the equalizer reduces changes in the frequency response and/or phase caused by one, more, or all of the cited units. In an analogous form, the equalizer may be realized by highpasses, lowpasses, or bandpasses. The equalizer may be digitally realized by delay elements, summation elements, or also a Fourier transformation, for example.

The equalizer may reduce signal changes on the transmission path and thus enable the original signals and information content of the original signals to be regained.

The above-described characteristics, features, and advantages of the present embodiments, as well as the manner in which these are achieved, will become clearer and more readily understandable in connection with the following description of the exemplary embodiments, which are explained in more detail in conjunction with the drawings.

DETAILED DESCRIPTION

Figure 1:
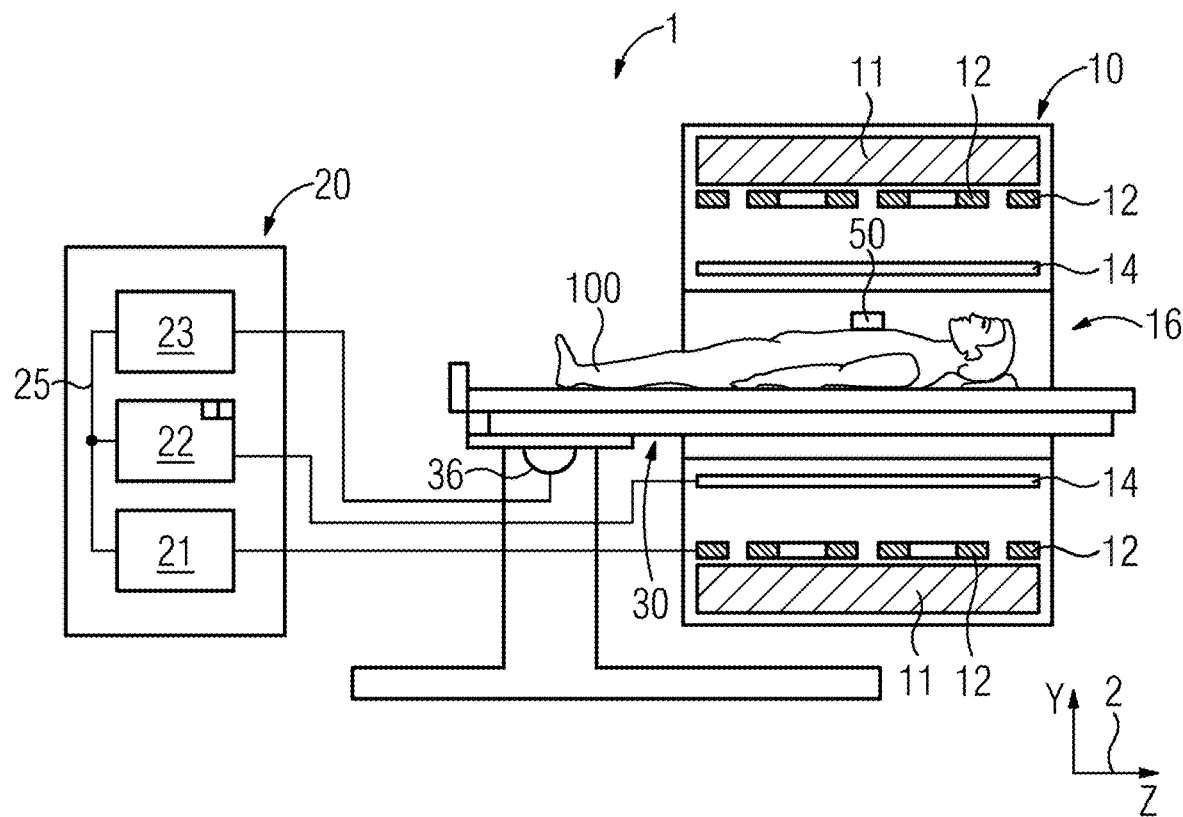
FIG. 1 shows a schematic overview of a magnetic resonance tomography system with one embodiment of a device.

FIG. 1 shows a schematic representation of an embodiment of a magnetic resonance tomography system 1 with an embodiment of a local coil 50.

The magnet unit 10 has a field magnet 11 that generates a static magnetic field BO for aligning nuclear spins of samples or a patient 100 in a recording area. The recording area is characterized by an extremely homogenous static magnetic field BO, where the homogeneity relates, for example, to a magnetic field strength or an amount. The recording area is almost spherical and arranged in a patient tunnel 16 that extends in a longitudinal direction 2 through the magnet unit 10. A patient couch 30 may be moved by the moving unit 36 in the patient tunnel 16. The field magnet 11 may be a superconducting magnet that may provide magnetic fields having a magnetic flux density of up to 3T or even higher in the latest equipment. For lower field strengths, however, permanent magnets or electromagnets having normally conducting coils may also be used.

The magnet unit 10 also has gradient coils 12 that are configured, for spatial differentiation of the acquired imaging regions in the examination volume, to overlay variable magnetic fields onto the magnetic field BO in three spatial directions. The gradient coils 12 are typically coils made of normally conducting wires that may generate mutually orthogonal fields in the examination volume.

The magnet unit 10 likewise has a body coil 14 configured to radiate into the examination volume a radio frequency signal supplied via a signal line, and to receive resonance signals emitted by the patient 100 and to output the resonance signals via a signal line.

A control unit 20 (e.g., a controller) supplies the magnet unit 10 with the various signals for the gradient coils 12 and the body coil 14 and evaluates the signals received.

Thus, the control unit 20 has a gradient control 21 configured to provide the gradient coils 12 with variable currents via supply lines. The variable currents provide the desired gradient fields in the examination volume on a temporally coordinated basis.

The control unit 20 has a radio frequency unit 22 that is configured to generate a radio frequency pulse with a predetermined temporal sequence, amplitude, and spectral power distribution for excitation of a magnetic resonance of the nuclear spins in the patient 100. Thereby, pulse power levels in the region of kilowatts may be achieved. The excitation pulses may be radiated into the patient 100 via the body coil 14 or also via a local transmit antenna.

A controller 23 communicates with the gradient control 21 and the radio frequency unit 22 via a signal bus 25.

A local coil 50 is arranged on the patient 100 and has a wireless signal connection to the radio frequency unit 22 and a receiver 61 of the radio frequency unit 22.

Figure 2:
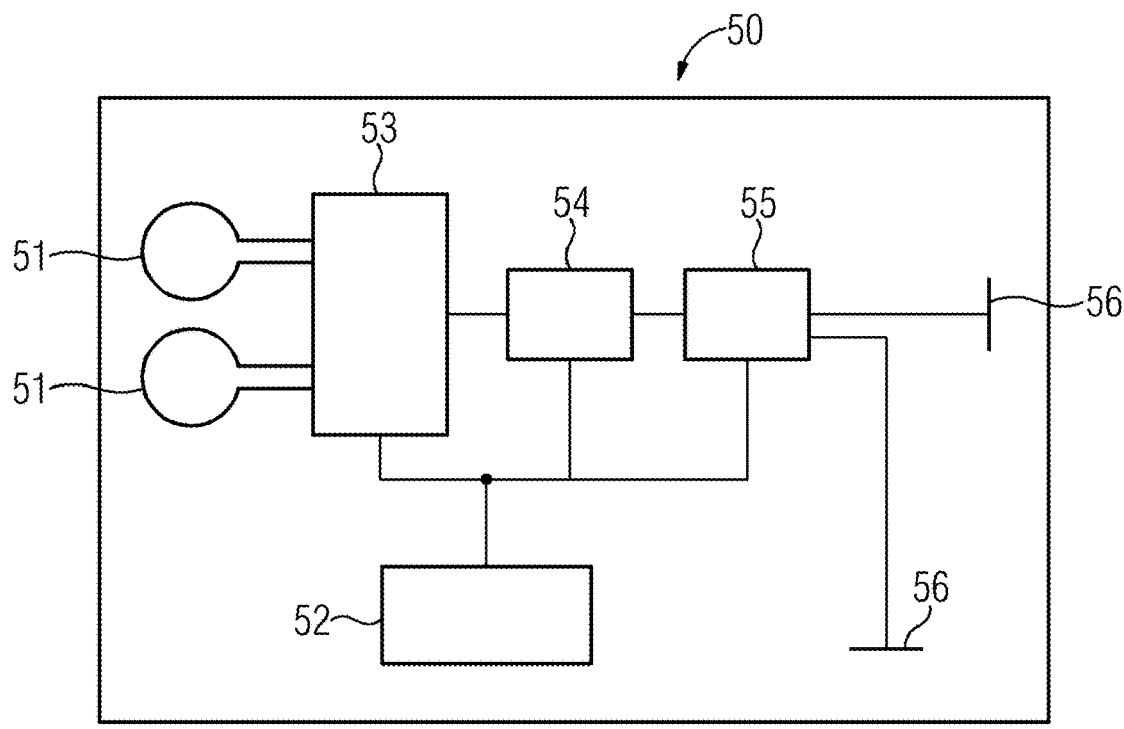
FIG. 2 shows a schematic representation of a local coil with one embodiment of a device.

FIG. 2 shows a schematic representation of a local coil 50 with one embodiment of a device. The local coil has one or more antenna coils 51 that are configured to receive a magnetic resonance signal from the patient 100. The magnetic resonance signal received by the antenna coil/coils 51 may then be processed by an analog signal processing (e.g., a preamplifier (low noise amplifier LNA) and/or an input filter). The device also has a first analog-digital converter 53 that digitalizes the magnetic resonance signal. The analog-digital converter has a scanning rate that, according to Nyquist's theorem, corresponds to at least twice the highest useful frequency of the magnetic resonance signal. In one embodiment, the magnetic resonance signal may firstly be converted in an analog manner into a base band by an oscillator and mixer before the AD conversion takes place. In one embodiment, a digital frequency conversion may take place by the analog-digital converter 53 by subscanning. In one embodiment, the magnetic resonance signals of a number of antenna coils 51 may be converted and multiplexed in parallel by an analog multiplexer and sample-and-hold elements of the analog-digital converter 53.

The device has a signal conditioner 54. A result of the analog-digital conversion is converted into a frequency range of an ultra wideband (UWM) in as direct a way as possible for the transmission. In one embodiment, this may be achieved by increasing the harmonic component so that an appreciable component of the energy of the output signal of the signal conditioner is present in the UWB. This may be achieved, for example, by edges of the digital signal being made steeper by the comparator, trigger, or radio frequency amplifier.

In another embodiment, the signal conditioner 54 may also be a logic circuit configured to increase the bit rate. The signal conditioner 54 may be a circuit, for example, that carries out a simple upsampling by bit doubling or multiplication. Each bit may be replaced by a bit sample including two or correspondingly more bits, where the bit sample contains a level change. Scramblers or other digital methods, which increase the bit frequency in a deterministic way, may also be provided, however. Switching circuits that add redundancy information and, in this way, increase the data rate and thus the frequency are also possible.

The signal conditioner 54 may also be realized as part of the first analog-digital converter 53. In one embodiment, the clock frequency and thus also the components of the harmonics in an UWB may be increased by multiplexing a number of magnetic resonance signals.

Regulatory requirements on a transmission in UWB require that emissions of electromagnetic waves outside of the UWB are damped sufficiently strongly in order not to interfere with radio services in these frequency ranges. The device therefore has a pulse filter 55 that suppresses frequency components of the output signal of the signal conditioner 54 in these frequency ranges outside of the UWB by more than 12 dB, 24 dB, 40 dB or 60 dB. Filters of this type may be provided by individual or cascading of highpasses, lowpasses or bandpasses including resistors, capacitors, and/or inductors such as Pi or T filters. Other filter technologies such as, for example, line circuits, cavity resonators, or surface wave filters may also be provided, however.

Figure 4:
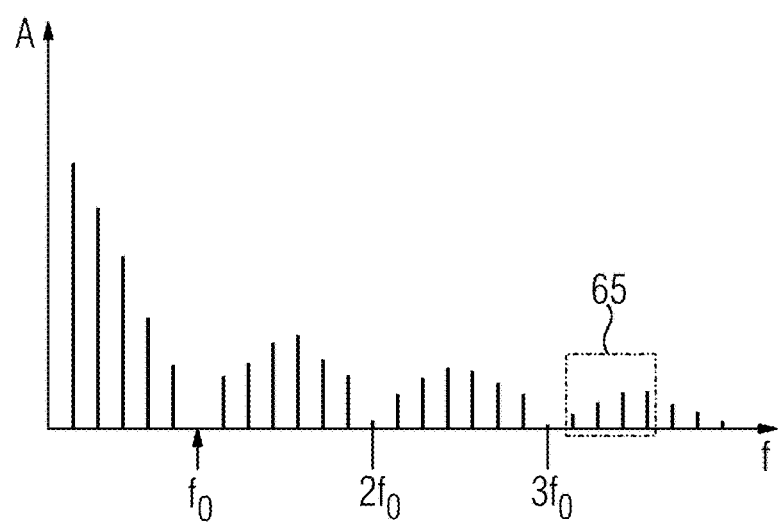
FIG. 4 shows an exemplary frequency diagram.

FIG. 4 shows an exemplary frequency diagram. The frequency f is plotted on the x-coordinate, and the amplitude A is plotted on the y-coordinate. The output signal of the first analog-digital converter 53 has basic frequency parts, up to the frequency $f_0$, which carry the information and correspond to the basic frequencies of the output pulses of the first analog-digital converter 53. Between $f_0$ and $2 \times f_0$ and between $2 \times f_0$ and $3 \times f_0$, the first and second harmonics of the signal are shown between frequency 0 and $2 \times f_0$. These have, in each case, a lower amplitude or energy. For a rectangular signal, the amplitude reduces for the n'th harmonic with 1/n, and for harmonic signals, the harmonic component moves to zero. The signal conditioner 54 may therefore maximize the harmonic component in the form of a Schmitt trigger by the steepest possible edges, for example.

Through the filter passband range indicated with the window 65, the frequency range through which the pulse filter 55 passes is indicated. The filter bandpass range may correspond to, for example, a subarea of one or an entire ultra wideband.

The output signal of the pulse filter 55 limited to a UWB is supplied to a transmit antenna 56 of the device in order to transmit the information of the magnetic resonance signal or signals to the receiver 61 of the magnetic resonance tomography system 1 as electromagnetic waves. In one embodiment, the output signal may be output via a plurality of transmit antennas 56 in order to prevent an interruption in the transmission if a transmit antenna 56 is concealed by the body of the patient 100, for example.

The individual functional groups of the local coil 50 are supplied with energy by an energy supply 52. Since the local coil 50 transmits the magnetic resonance signals wirelessly to the magnetic resonance tomography system 1, supplying energy to the local coils 50 may be carried out without permanent electrical connection to the magnetic resonance tomography system 1. A rechargeable battery may therefore be provided in the local coil 50 as a power supply 52. The local coil is charged on a charging station. A wireless energy supply 52 (e.g., via an induction loop) may also be provided.

Figure 3:
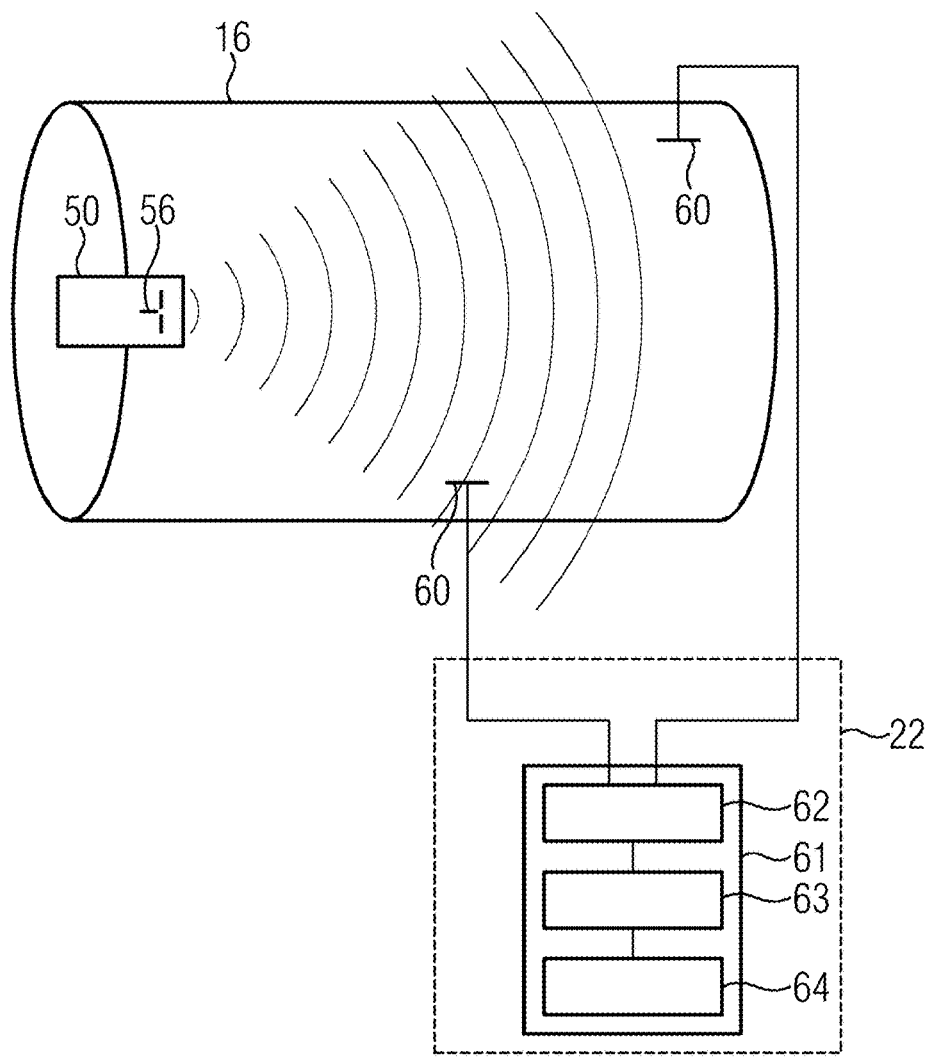
FIG. 3 shows a schematic partial representation of one embodiment of a magnetic resonance tomography system with an embodiment of a local coil.

FIG. 3 shows a schematic partial representation of one embodiment of a magnetic resonance tomography system 1 with an embodiment of a local coil 50, which, for example, explains the interaction between the device in the local coil 50 and the magnetic resonance tomography system 1.

In order to receive the electromagnetic waves emitted by the transmit antenna 56 of the local coil 50, the magnetic resonance tomography system 1 has at least one receive antenna 60 (e.g., a number of receive antennas 60) that is arranged in or in the vicinity of the patient tunnel 16. In the case of a number of receive antennas 60, these are spaced apart from one another so that by diversity a continuous reception is also provided with different positions of the patient couch 30. This may be achieved, for example, by the distance between the antennas greater than the half, a whole, or a number of wavelengths being the lambda of the electromagnetic waves emitted by the transmit antenna/s 56. A selection circuit 62 may then select the antenna with the strongest signal.

In one embodiment, a number of receive antennas 60 may form a matrix, and the selection circuit 62 may have a device for variable phase displacement and summation so that a flexible directivity onto the local coil 50 may be adjusted by an antenna controller in order to provide and optimize the reception.

The received signal is then digitalized by a second analog-digital converter 63 for further processing. Amplification and filtering may still take place in advance in order to reduce an aliasing of interference signals from frequency ranges outside of the UWB and to optimally use the dynamics of the analog-digital converter. A frequency conversion of the receive signal into a base band may also be provided by analog mixing or digital subscanning. With increasingly available rapid, cost-effective, and energy-saving digital switching circuits, the combination or selection of the antenna signals may only take place digitally after digitalization by the second analog-digital converter 62.

A digital signal processing device 64 then obtains the original information of the magnetic resonance signal. With a known original pulse shape (e.g., rectangle), the original signal may be regained from a part of the harmonic spectrum. For example, after a Fourier transformation, the coefficients of the lower frequencies of the m'th harmonic (e.g., harmonic of the order zero is the basic frequency) may be reconstructed from the received signal of the n'th harmonic by multiplication with the factor n/m. The reconstruction may vary depending on the original pulse shape assumed.

When a scrambler is used on the transmit side of the local coil 50, corresponding complementary algorithms may be applied in order to regain the original signals. When several channels are multiplexed on the transmit side by suitable bit patterns, a synchronization may be achieved on the receive side in order to be able to separate the channels again.

Figure 5:
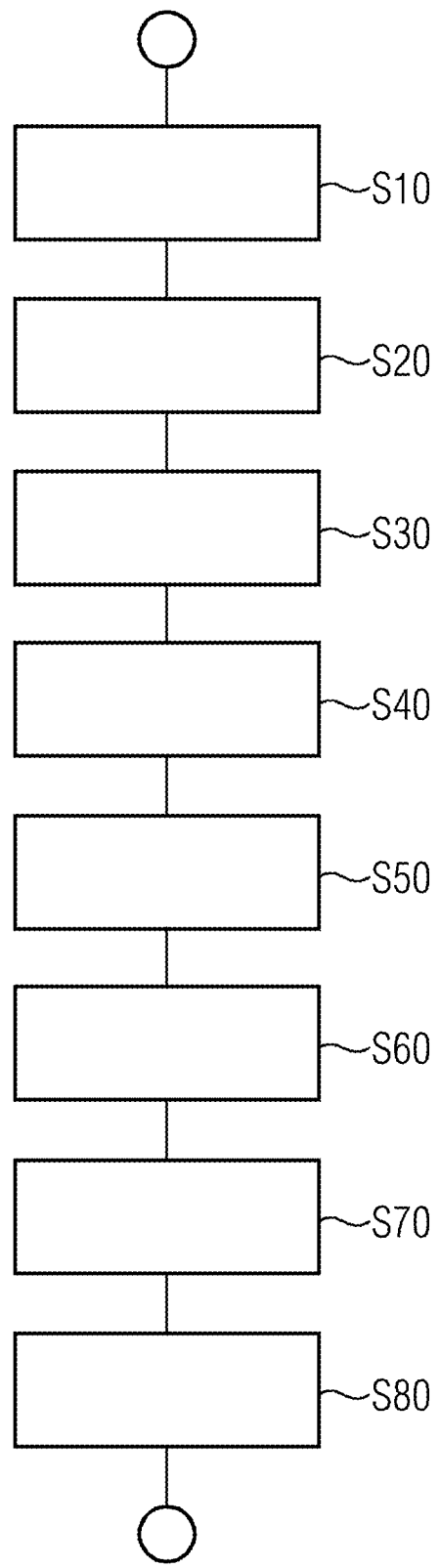
FIG. 5 shows a schematic flow chart of one embodiment of a method.

FIG. 5 shows a schematic flow chart of one embodiment of a method.

In act S10, the local coil 50 receives a magnetic resonance signal using the antenna coil 51. The receiving may also include amplification with an LNA and/or the filtering of the magnetic resonance signal with respect to a frequency response.

In act S20, the first analog-digital converter 53 digitalizes the magnetic resonance signal.

In act S30, the signal conditioner 54 increases a harmonic component in an output signal of the first analog-digital converter 53. A frequency component of the output signal of the signal conditioner 54, which lies above the basic frequency or scanning rate of the first analog-digital converter 53, may be, in the more general sense, a harmonic component. If the signal conditioner 53 is provided by a Schmitt trigger, for example, which increases the edge steepness of the digital signal, this involves harmonics in the classical sense. Within the present embodiments, higher frequency components produced also by scrambling or by digital signal multiplex, for example, are, however, also considered in the signal according to the first analog-digital converter 53. In this respect, the digital signal is itself considered at this point with respect to the frequency components like an analog signal and not numerical information content of the digital signal.

In act S40, the pulse filter 55 restricts the output signal of the signal conditioner 54 to a predetermined frequency band. The pulse filter may be a Pi or T filter or also another type of bandpass filter, for example. The restricted frequency range may correspond, for example, to a regulatorily predetermined ultra wideband.

In act S50, a radio frequency signal is emitted as a function of an output signal of the pulse filter 55 via the transmit antenna 56. In one embodiment, an amplification of the filtered signal may still take place beforehand.

In act S60, the receive antenna 60 receives the radio frequency signal. The receiving may also include a preamplification and filtering of unwanted frequency ranges outside of the UWB.

In act S70, the second analog-digital converter 63 digitalizes the received radio frequency signal, so that in act S80, a signal processing device 64 regains a digital representation of the magnetic resonance signal. Different options for regaining are already cited in more detail with respect to FIG. 3.

In further conceivable acts using the conventional reconstruction method (e.g., by the control unit 20), an image of the patient 100 may be obtained from the digital representation and may be output on a display.

Although the invention has been illustrated and described in greater detail with the exemplary embodiments, the invention is not restricted by the examples disclosed, and other variations may be derived therefrom by the person skilled in the art without departing from the protective scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for generating wideband signals in local coils, the device comprising:
   a first analog-digital converter;
   a signal conditioner;
   a pulse filter; and
   a transmit antenna,
   wherein the first analog-digital converter has a signal connection with an antenna coil of the local coil and is configured to digitize a magnetic resonance signal received by the antenna coil,
   wherein the signal conditioner is configured to increase a harmonic component in an output signal of the first analog-digital converter,
   wherein the pulse filter is configured to restrict the output signal of the signal conditioner to a predetermined frequency band, and
   wherein the transmit antenna has a signal connection with the signal conditioner and is configured to send a radio frequency signal as a function of an output signal of the pulse filter.

2. The device of claim 1, wherein the signal conditioner is a Schmitt trigger, a comparator, or a radio frequency amplifier.

3. The device of claim 2, wherein the pulse filter is a bandpass filter.

4. The device of claim 1, wherein the signal conditioner is a logic circuit configured to increase a bit rate.

5. The device of claim 4, wherein the pulse filter is a bandpass filter.

6. The device of claim 1, wherein the pulse filter is a bandpass filter.

7. A magnetic resonance tomography system comprising:
   a local coil comprising:
      a device for generating wideband signals in the local coils, the device comprising:
         a first analog-digital converter;
         a signal conditioner;
         a pulse filter; and
         a transmit antenna, wherein the first analog-digital converter has a signal connection with an antenna coil of the local coil and is configured to digitize a magnetic resonance signal received by the antenna coil, wherein the signal conditioner is configured to increase a harmonic component in an output signal of the first analog-digital converter, wherein the pulse filter is configured to restrict the output signal of the signal conditioner to a predetermined frequency band, and wherein the transmit antenna has a signal connection with the signal conditioner and is configured to send a radio frequency signal as a function of an output signal of the pulse filter; and
   a receiver comprising:
      a receive antenna;
      a second analog-digital converter; and
      a digital signal processor,
   wherein the receive antenna is configured to receive a signal of the local coil,
   wherein the second analog-digital converter is configured to digitize the received signal of the local coil, and
   wherein the signal processing device is configured to regain a digital representation of a magnetic resonance signal of the local coil from the output signal of the second analog-digital converter.

8. The magnetic resonance tomography system of claim 7, wherein the receiver further comprises a mixer, the mixer being configured to convert the signal of the local coil received by the receive antenna into a lower frequency band.

9. The magnetic resonance tomography system of claim 8, wherein the receiver further comprises an equalizer configured to compensate for a frequency response characteristic of the signal conditioner, the pulse filter, the transmit antenna, the receive antenna, or any combination thereof.

10. The magnetic resonance tomography system of claim 7, wherein the receiver further comprises a plurality of receive antennas, the plurality of receive antennas comprising the receive antenna,
    wherein the plurality of receive antennas are spaced apart from one another, and
    wherein the receiver further comprises a selection circuit configured to select one or a combination of the signals of the plurality of receive antennas with an improved signal-to-noise ratio.

11. The magnetic resonance tomography system of claim 10, wherein the receiver further comprises an equalizer configured to compensate for a frequency response characteristic of the signal conditioner, the pulse filter, the transmit antenna, the receive antenna, or any combination thereof.

12. The magnetic resonance tomography system of claim 7, wherein the receiver further comprises an equalizer configured to compensate for a frequency response characteristic of the signal conditioner, the pulse filter, the transmit antenna, the receive antenna, or any combination thereof.

13. A method for operating a magnetic resonance tomography system, the method comprising:
    receiving, by an antenna coil, a magnetic resonance signal;
    digitizing, by a first analog-digital converter, the magnetic resonance signal;
    increasing, by a signal conditioner, a harmonic component in an output signal of the first analog-digital converter with a signal conditioner;
    restricting, by a pulse filter, an output signal of the signal conditioner to a predetermined frequency band;
    emitting a radio frequency signal as a function of an output signal of the pulse filter via a transmit antenna;
    receiving the radio frequency signal with a receive antenna;
    digitizing, by a second analog-digital converter, the received radio frequency signal; and
    regaining, by a signal processor, a digital representation of the magnetic resonance signal from an output signal of the second analog-digital converter.

* * * * *